US012641755B2

(12) United States Patent
Kumar et al.

(10) Patent No.: US 12,641,755 B2
(45) Date of Patent: May 26, 2026

(54) SYSTEM AND DESIGN METHOD OF A THERMALLY OPTIMIZED COMBINED CENTRALIZED AND DISTRIBUTED UNIT

(71) Applicant: JIO PLATFORMS LIMITED, Ahmedabad (IN)

(72) Inventors: Narender Kumar, South Delhi (IN); Shakti Singh, Gurgaon (IN); Amrish Bansal, Navi Mumbai (IN); Brijesh Shah, Navi Mumbai (IN); Bajinder Pal Singh, Janakpuri (IN); Selvakumar Ganesan, Tirupur (IN)

(73) Assignee: JIO PLATFORMS LIMITED, Ahmedabad (IN)

( * ) Notice: Subject to any disclaimer, the term of this patent is extended or adjusted under 35 U.S.C. 154(b) by 423 days.

(21) Appl. No.: 18/029,681

(22) PCT Filed: Mar. 24, 2023

(86) PCT No.: PCT/IB2023/052920
§ 371 (c)(1),
(2) Date: Mar. 31, 2023

(87) PCT Pub. No.: WO2023/187571
PCT Pub. Date: Oct. 5, 2023

(65) Prior Publication Data
US 2025/0089220 A1 Mar. 13, 2025

(30) Foreign Application Priority Data
Mar. 31, 2022 (IN) .............................. 202221019337

(51) Int. Cl.
*G06F 1/20* (2006.01)
*H05K 7/20* (2006.01)

(52) U.S. Cl.
CPC ............. *H05K 7/207* (2013.01); *G06F 1/206* (2013.01); *H05K 7/20172* (2013.01); *H05K 7/20263* (2013.01); *G06F 2200/201* (2013.01)

(58) Field of Classification Search
CPC ...................................................... G06F 1/206
See application file for complete search history.

(56) References Cited

U.S. PATENT DOCUMENTS 11,157,051 B2 10/2021 Lee et al.
2010/0097821 A1* 4/2010 Huang .................... F21S 8/065
362/555

(Continued)

FOREIGN PATENT DOCUMENTS

WO 2021253813 A1 12/2021

OTHER PUBLICATIONS

International Search Report issued by the International Searching Authority issued in related Foreign Application No. PCT/IB2023/052920, mailed Jul. 10, 2023 (1 pg.).

*Primary Examiner* — Suresh Suryawanshi
(74) *Attorney, Agent, or Firm* — FINNEGAN, HENDERSON, FARABOW, GARRETT & DUNNER, LLP

(57) ABSTRACT

The present invention provides an efficient hardware architecture for an ORAN compliant thermal management module for a combined centralized unit and a distributed unit (CCDU) for a 5G basement application required for processing L1, L2 and L3 scheduling of the network. The CCDU design may provide the functionality of a CU and a DU with single unit and can operate over wide temperature range. A single board approach of the CCDU make the CCDU more reliable and less costly. The CCDU can support different kinds of synchronization and can provide site alarms over dry contacts to equip with external alarm device.

9 Claims, 6 Drawing Sheets

(56) References Cited

U.S. PATENT DOCUMENTS

| | | | |
|---|---|---|---|
| 2011/0001438 A1* | 1/2011 | Chemel | H05B 47/155 |
| | | | 315/297 |
| 2015/0035437 A1* | 2/2015 | Panopoulos | H05B 47/175 |
| | | | 315/291 |
| 2018/0287228 A1* | 10/2018 | Karlson | H01M 10/613 |
| 2019/0268950 A1 | 8/2019 | Youtz et al. | |
| 2020/0125148 A1 | 4/2020 | Lee et al. | |
| 2020/0338957 A1* | 10/2020 | Kim | F01P 7/026 |
| 2022/0239199 A1* | 7/2022 | Salam | H02K 9/223 |

\* cited by examiner

SYSTEM AND DESIGN METHOD OF A THERMALLY OPTIMIZED COMBINED CENTRALIZED AND DISTRIBUTED UNIT

RESERVATION OF RIGHTS

FIELD OF INVENTION

The embodiments of the present disclosure generally relate to telecommunication basement application. More particularly, the present disclosure relates to design of a thermal management module of a combined centralized and distributed unit (CCDU).

BACKGROUND OF THE INVENTION

The following description of related art is intended to provide background information pertaining to the field of the disclosure. This section may include certain aspects of the art that may be related to various features of the present disclosure. However, it should be appreciated that this section be used only to enhance the understanding of the reader with respect to the present disclosure, and not as admissions of prior art.

The fifth generation (5G) technology is expected to fundamentally transform the role that telecommunications technology plays in the industry and society at large. A gNodeB is a 3GPP-compliant implementation of a 5G-NR base station. It consists of independent Network Functions, which implement 3GPP-compliant NR Radio access network (RAN) protocols namely: physical layer (PHY), media access control layer (MAC), radio link control (RLC), Packet Data Convergence Protocol (PDCP), service data adaptation protocol (SDAP), radio resource control (RRC), Network Real-time Analysis Platform (NRAP). The gNB further incorporates three functional modules: the CU, the DU and the Radio Unit (RU), which can be deployed in multiple combinations. They can run together or independently and can be deployed on either physical (e.g. a small cell chipset) or virtual resources (e.g. dedicated COTS server or shared cloud resources). The CU provides support for the higher layers of the protocol stack such as SDAP, PDCP and RRC while the DU provides support for the lower layers of the protocol stack such as radio link control (RLC), media access control (MAC) and Physical layer. In a 5G radio access network (RAN) architecture, the DU in the baseband unit (BBU) is responsible for real time Layer 1 and Layer 2 scheduling functions of the 5G protocol stack layer and the CU is responsible for non-real time, higher L2 and L3 of the 5G protocol stack layer. These technologies consist of a higher density of components in tight, confined spaces. Coupled with that is the increased power required. 5G energy consumption generates heat, which can lead to component failure—and creates 5G network problems, namely dips or even complete outages and downtime. As more data is collected and processed in the cloud, processing off-loaded data consumes more and more power—and generates more heat.

With high temperatures come electro migration. The radiation of embedded antennas weakens at the frequencies required. For 5G to deploy on a large scale, thermal management is therefore a top priority for 5G base station designs.

The challenges with 5G not only encompass base stations, but also device form factors, such as smart phones. Heat dissipation impacts a device's maximum receiving rate. If the device is unable to manage heat, its data handling performance is compromised. Any solution that addresses 5G heat dissipation in base stations will need to be compatible with the requirements of device form factors while working seamlessly with core functionality.

Hence, there is a need in the art to provide for a thermal management module of the compact CCDU that can overcome the shortcomings of the existing prior art.

OBJECTS OF THE PRESENT DISCLOSURE

Some of the objects of the present disclosure, which at least one embodiment herein satisfies are as listed herein below.

It is an object of the present disclosure to provide a thermal management system that protects the system against extreme weather, climatic and heat conditions.

It is an object of the present disclosure to provide a thermal management technique that protects the system and sends alarm during critical conditions.

SUMMARY

This section is provided to introduce certain objects and aspects of the present invention in a simplified form that are further described below in the detailed description. This summary is not intended to identify the key features or the scope of the claimed subject matter.

In order to achieve the aforementioned objectives, the present invention provides a thermal management system in a combined centralized and distributive unit (CCDU). The system may include a single integrated board that further includes a housing with a thermal management unit, the thermal management unit operatively coupled to a processing unit. The processing unit may be coupled to a memory, the memory storing instructions on execution of which, the processing unit causes the system to: receive a set of signals pertaining to temperature of the system; compare the set of signals with a predefined threshold temperature range; and, execute one or more thermal management techniques if the temperature of the set of signals is more than the predefined threshold temperature range.

In an embodiment, the one or more thermal management techniques may include Liquid cooling, use of PCB materials, use of Vapour-chamber cooling, use of Heat-sink devices, use of Gallium Nitride (GaN), and use of radio-over-fibre (RoF).

In an embodiment, the thermal management unit may be configured such that the system may withstand extreme climatic conditions and surrounding environmental conditions.

In an embodiment, the thermal management module may be operatively coupled with an alarm device that may send alarm signals over dry contacts, temperature rise, critical environment conditions and critical electronic conditions.

3
4

In an embodiment, the thermal management unit may include a base insulator configured at the base of the CCDU. A plurality of heat sinks may be configured on the base insulator to dissipate heat generated from the thermal management unit.

In an embodiment, the base insulator may be a chassis base insulator configured to insulate a plurality of electrically conductive chassis.

In an embodiment, a plurality of fans may be configured with the CCDU to enable the dissipation of heat generated from the plurality of heat sinks.

In an embodiment, the thermal management unit may include an air duct to allow an airflow into the CCDU and enhance the dissipation of heat generated from the plurality of heat sinks.

In an aspect, the present disclosure includes a method for heat dissipation by a thermal management system in a combined centralized and distributive unit (CCDU). The method may include receiving, by a processing unit, a set of signals pertaining to temperature of a system. The method may include comparing, by the processing unit, the set of signals with a predefined threshold temperature range. The method may include executing, by the processing unit, one or more thermal management techniques if the temperature of the set of signals is more than the predefined threshold temperature range.

In an aspect, a non-transitory computer readable medium may include a processor with executable instructions that may cause the processor to receive a set of signals pertaining to temperature of a system. The processor may compare the set of signals with a predefined threshold temperature range. The processor may execute one or more thermal management techniques if the temperature of the set of signals is more than the predefined threshold temperature range.

BRIEF DESCRIPTION OF DRAWINGS

The accompanying drawings, which are incorporated herein, and constitute a part of this invention, illustrate exemplary embodiments of the disclosed methods and systems in which like reference numerals refer to the same parts throughout the different drawings. Components in the drawings are not necessarily to scale, emphasis instead being placed upon clearly illustrating the principles of the present invention. Some drawings may indicate the components using block diagrams and may not represent the internal circuitry of each component. It will be appreciated by those skilled in the art that invention of such drawings includes the invention of electrical components, electronic components or circuitry commonly used to implement such components.

Figure 1A:
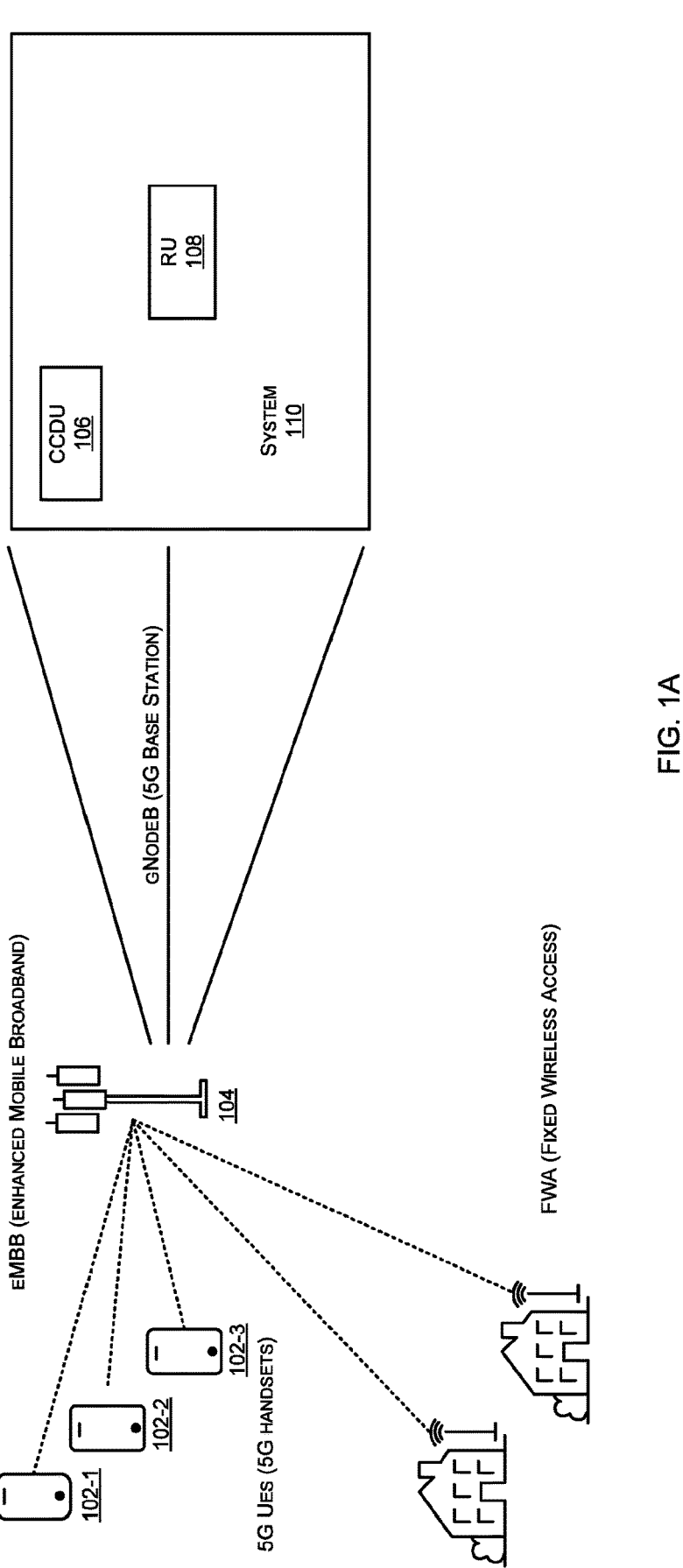
FIG. 1A illustrates an exemplary network architecture in which or with which proposed system of the present disclosure can be implemented, in accordance with an embodiment of the present disclosure.

The foregoing shall be more apparent from the following more detailed description of the invention.

DETAILED DESCRIPTION OF INVENTION

In the following description, for the purposes of explanation, various specific details are set forth in order to provide a thorough understanding of embodiments of the present disclosure. It will be apparent, however, that embodiments of the present disclosure may be practiced without these specific details. Several features described hereafter can each be used independently of one another or with any combination of other features. An individual feature may not address all of the problems discussed above or might address only some of the problems discussed above. Some of the problems discussed above might not be fully addressed by any of the features described herein.

The ensuing description provides exemplary embodiments only, and is not intended to limit the scope, applicability, or configuration of the disclosure. Rather, the ensuing description of the exemplary embodiments will provide those skilled in the art with an enabling description for implementing an exemplary embodiment. It should be understood that various changes may be made in the function and arrangement of elements without departing from the spirit and scope of the invention as set forth.

Specific details are given in the following description to provide a thorough understanding of the embodiments. However, it will be understood by one of ordinary skill in the art that the embodiments may be practiced without these specific details. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed but could have additional steps not included in a figure. A process may correspond to a method, a function, a procedure, a subroutine, a subprogram, etc. When a process corresponds to a function, its termination can correspond to a return of the function to the calling function or the main function.

The word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

Reference throughout this specification to "one embodiment" or "an embodiment" or "an instance" or "one instance" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

In the disclosure, various embodiments are described using terms used in some communication standards (e.g., 3rd generation partnership project (3GPP), extensible radio access network (xRAN), and open-radio access network (O-RAN)), but these are merely examples for description. Various embodiments of the disclosure may also be easily modified and applied to other communication systems.

Typically, a base station is a network infrastructure that provides wireless access to one or more terminals. The base station has coverage defined to be a predetermined geographic area based on the distance over which a signal may be transmitted. The base station may be referred to as, in addition to "base station," "access point (AP)," "evolved NodeB (eNodeB) (eNB)," "5G node (5th generation node)," "next generation NodeB (gNB)," "wireless point," "transmission/reception point (TRP)," or other terms having equivalent technical meanings.

Further, a protocol stack or network stack is an implementation of a computer networking protocol suite or protocol family for a telecommunication system consisting of a plurality of network devices. A 5G protocol stack may include layer-1 (L1) which is a PHYSICAL Layer. The 5G layer-2 (L2) may include MAC, RLC and PDCP. The 5G layer-3 (L3) is the RRC layer.

The present invention provides an efficient hardware architecture for an ORAN compliant thermal management module for a combined centralized unit and a distributed unit (CCDU) for a 5G basement application required for processing L1, L2 and L3 scheduling of the network. The CCDU design may provide the functionality of a CU and a DU with single unit and can operate over wide temperature range. A single board approach of the CCDU make the CCDU more reliable and less costly. The CCDU can support different kinds of synchronization and can provide site alarms over dry contacts to equip with external alarm device. In this description, numerous specific details such as logic implementations, types and interrelationships of system components, etc., may be set forth in order to provide a more thorough understanding of some embodiments. It will be appreciated, however, by one skilled in the art that the invention may be practiced without such specific details. In other instances, control structures, gate level circuits, and/or full software instruction sequences have not been shown in detail in order not to obscure the invention. Those of ordinary skill in the art, with the included descriptions, will be able to implement appropriate functionality without undue experimentation.

Referring to FIG. 1A that illustrates an exemplary network architecture for a 5G New radio (NR) network (100) (also referred to as network architecture (100)) in which or with which the proposed system (110) can be implemented, in accordance with an embodiment of the present disclosure. As illustrated, the exemplary network architecture (100) may be equipped with the proposed system (110) that may be associated with a 5G base station (104) (also referred to as gNodeB (104)). The gNodeB (104) may include at least three functional modules such as a centralized unit (CU), a distributed unit (DU) CCDU (106) and a radio unit (RU) (108). The gNodeB (104) may be communicatively coupled to a plurality of first computing devices (102-1, 102-2, 102-3 . . . 102-N) (interchangeably referred to as user equipment (102-1, 102-2, 102-3 . . . 102-N) and (individually referred to as the user equipment (UE) (102) and collectively referred to as the UE (102)).

Figure 1B:
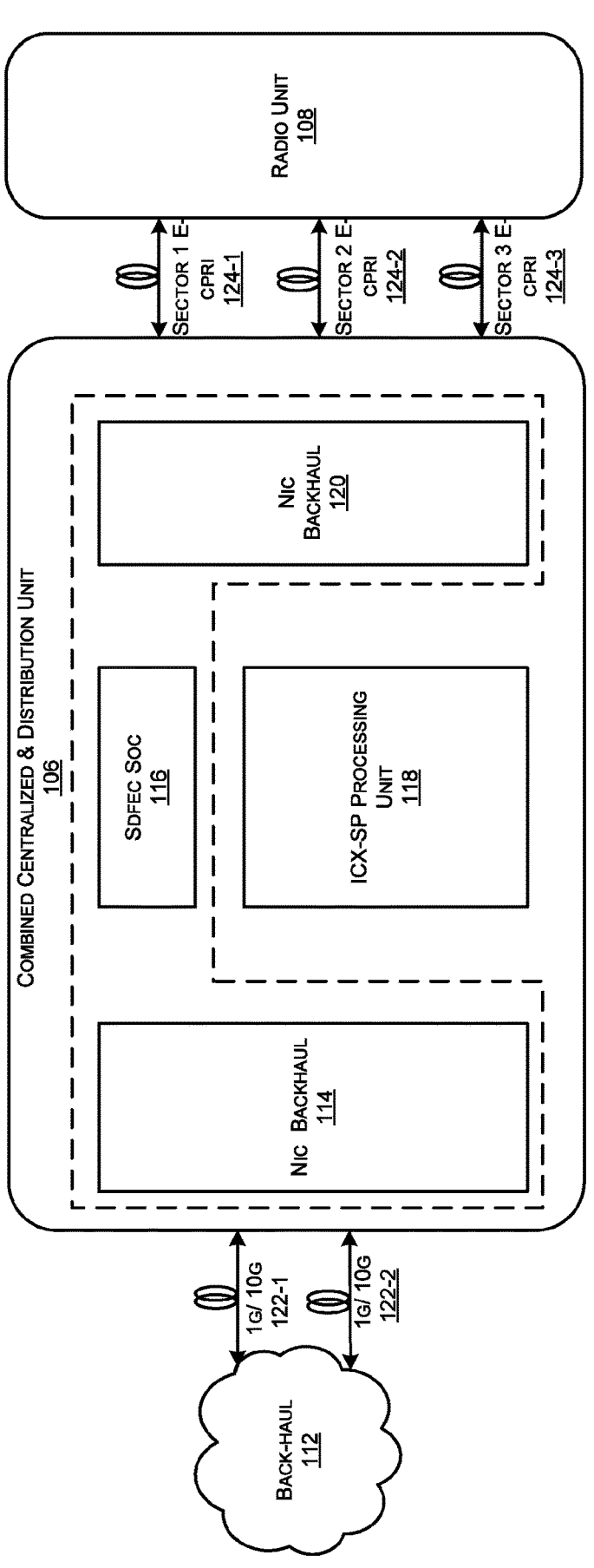
FIG. 1B illustrates an exemplary system architecture of the combined centralized and distributed unit (CCDU), in accordance with an embodiment of the present disclosure.

In an exemplary embodiment, the system (110) may be configured with a combined CU and DU in a single platform or PCB and is simply referred to as CCDU (106) as illustrated in FIG. 1B. The CCDU (106) may be operatively coupled to a radio unit (RU) (108) via one or more Network interface card (NIC) cards such as a backhaul Network interface card (NIC) (114), a fronthaul NIC (116), and the like. The CCDU (106) may include a processing unit (118), an accelerator unit that may include a Soft-Decision Forward Error Correction (SD-FEC) module (116), a local area network controller unit comprising the backhaul Network interface card (NIC) (114), the fronthaul NIC (116), and the like. The backhaul NIC (114) may be further communicatively coupled to a backhaul network (112).

Figure 2:
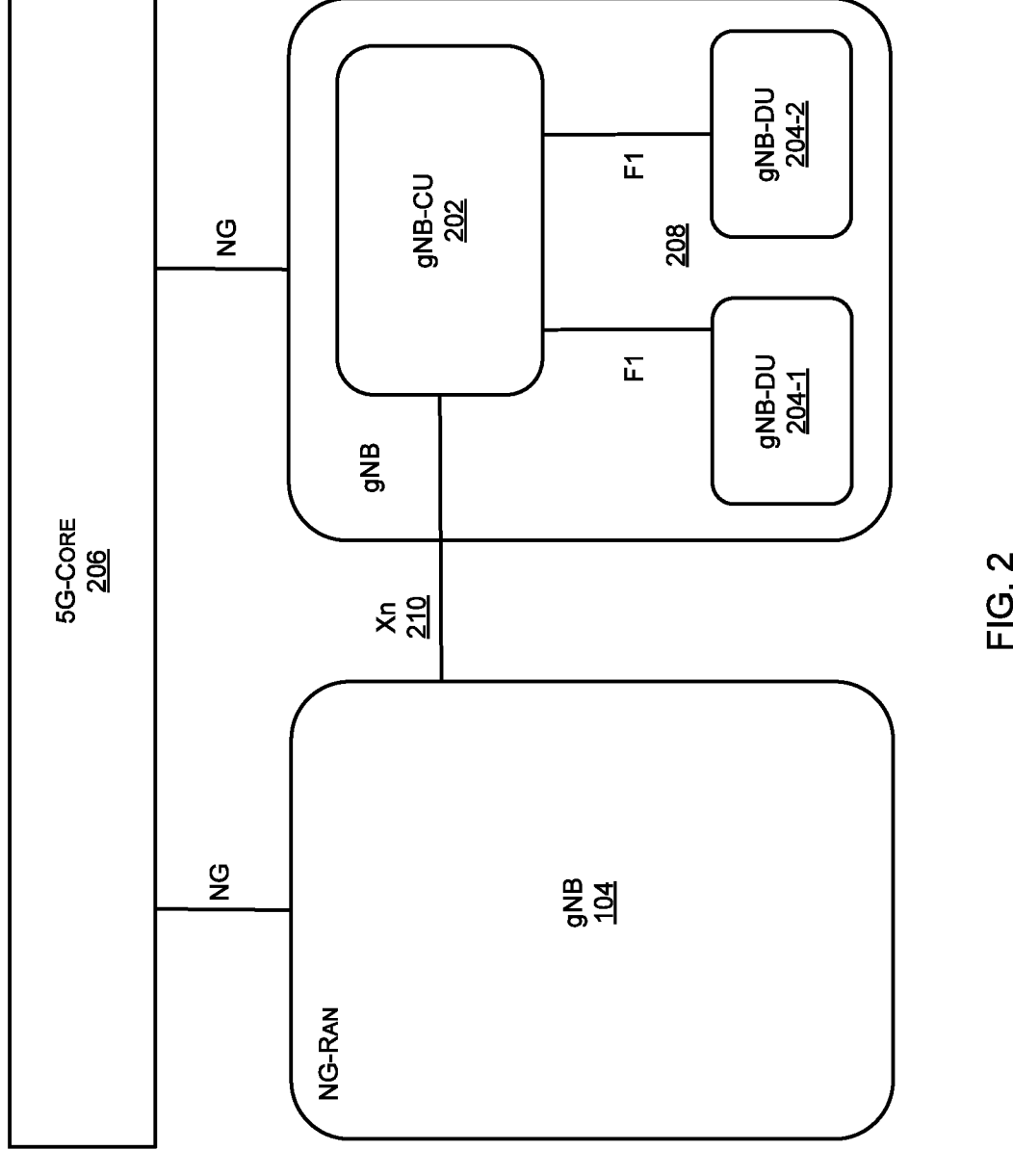
FIG. 2 illustrates an exemplary existing representation of a Centralized unit and a distributed unit of a gNodeB.

Generally, an existing gNodeB internal structure (200) for a 5G core (206) is shown in FIG. 2 where it can be quite clear to a person not skilled in the art that the existing CU (202) and DU (204) are separate units connected by an F1 interface (208).

Figure 3:
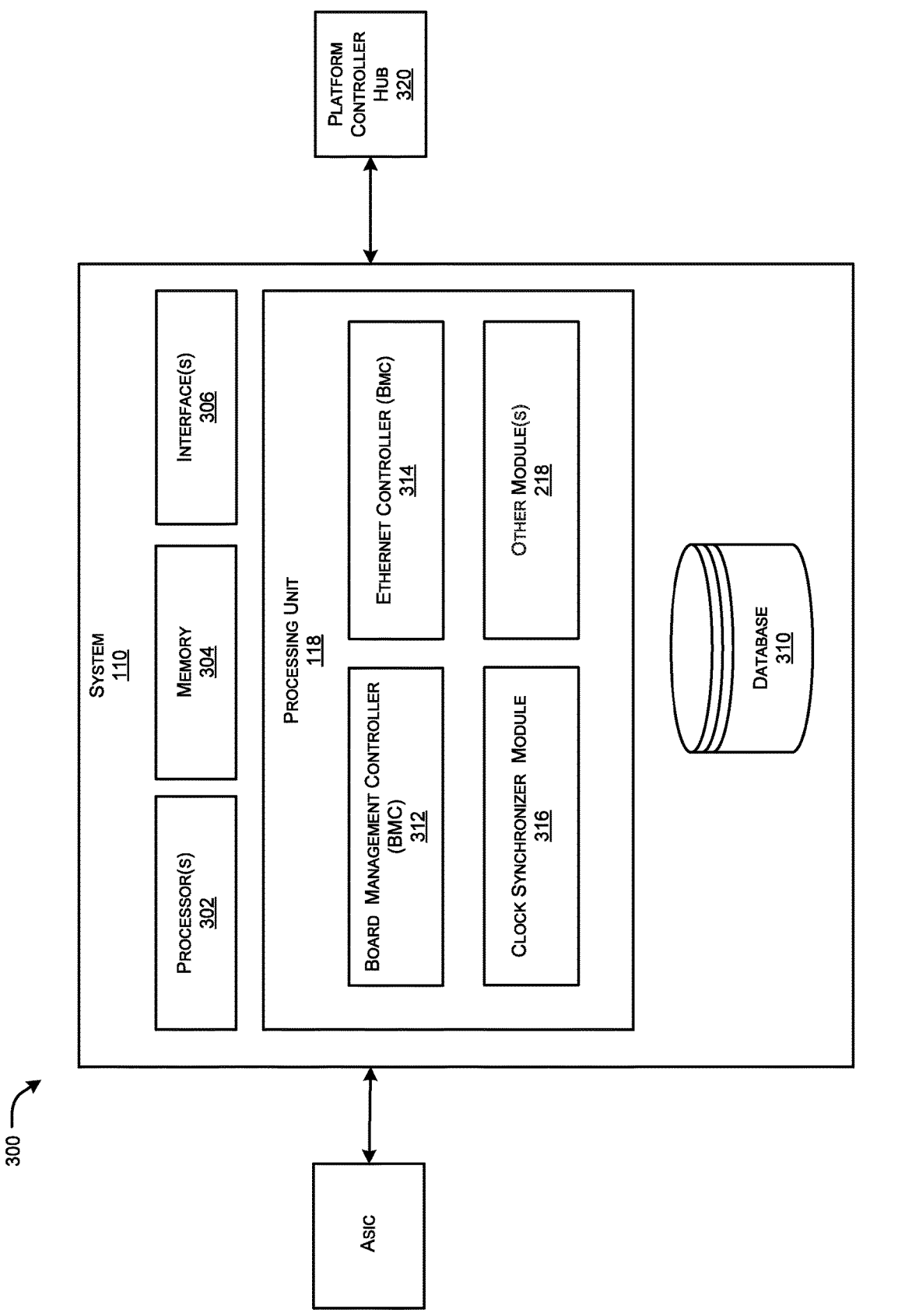
FIG. 3 illustrates an exemplary processing unit diagram of the CCDU, in accordance with an embodiment of the present disclosure.

In an exemplary embodiment, as illustrated in FIG. 3, the system (110) or the CCDU (106) may include one or more processors coupled with a memory, wherein the memory may store instructions which when executed by the one or more processors may cause system (110) to perform L1 and L2 functionalities. The one or more processor(s) (302) may be implemented as one or more microprocessors, microcomputers, microcontrollers, edge or fog microcontrollers, digital signal processors, central processing units, logic circuitries, and/or any devices that process data based on operational instructions. Among other capabilities, the one or more processor(s) (302) may be configured to fetch and execute computer-readable instructions stored in a memory of the CCDU (106). The memory may be configured to store one or more computer-readable instructions or routines in a non-transitory computer-readable storage medium, which may be fetched and executed to create or share data packets over a network service. The memory (304) may comprise any non-transitory storage device including, for example, volatile memory such as RAM, or non-volatile memory such as EPROM, flash memory, and the like.

In an embodiment, the system (110) may include a plurality of interfaces (306). The interfaces (306) may comprise a variety of interfaces, for example, interfaces for data input and output devices, referred to as I/O devices, storage devices, and the like. The interfaces (306) may facilitate communication of the system (110) with a plurality of platforms such as a platform controller hub (320) and an ASIC (318) comprising of (System on Chip) SoC components associated with the functioning of CCDU (106). In an exemplary embodiment, the SoC may include but not limited to the Soft-Decision Forward Error Correction (SD-FEC) module (116). The interface(s) (306) may also provide a communication pathway for one or more components of the CCDU (106). Examples of such components include, but are not limited to, processing unit/engine(s) (118) and a database (310).

In an exemplary embodiment, the CCDU (106) may be designed for an outdoor application to operate over a predefined temperature range and a predefined environment condition unlike COTS (Commercial of the shelf s) servers which are used in AC environment. For example, the predefined temperature range may go be from 0° to at least 60° C. in desert and other tropical and equatorial areas while predefined environment condition may include dry, humid, cold or dusty environment.

In an exemplary embodiment, the CCDU in the single board can have a chip down approach wherein one or more components corresponding to the NIC cards may be part of the single board that increases the mean time between failures (MTBF) and reduces the costs significantly. Since, the components are all combined in a single board hence separate components (cards) may not be required rather a single board may be used which will reduce not only the process of manufacturing but also will reduce the cost and increase the system reliability.

In an exemplary embodiment, the system (110) may be assembled in a single board (interchangeably referred to as LAN on motherboard (LOM)) having a predefined number of layers. The predefined number of layers ensure that the system is not bulky and heavy. In a way of example but not limitation, the predefined number of layers can be at least 14. In an example the system (110) may include one or more network connections directly connected to the LOM. Instead of requiring a separate network interface card to access a local-area network, such as Ethernet, the circuits may be attached to the single board. An advantage of the system (110) can be an extra available peripheral component interconnect (PCI) slot that is not being used by a network adapter.

In an exemplary embodiment, the system (110) may include at least Four (×4) 25G Fiber Optic (SFP) but not limited to it as a fronthaul connection to the fronthaul NIC (116) on but not limited to an eCPRI protocol and at least two (×2) 10G Fiber Optic (SFP) as a backhaul connection to the backhaul network (112).

In an exemplary embodiment, the system (110) may be further coupled to one or more alarm devices (not shown in the FIG. 1B) that may send alarm signals over dry contacts, temperature rise, critical environment conditions and critical electronic conditions. The system (110) may operate in a standard telecom power supply of −48 VDC but not limited to it with all required protection for telecom sites.

Processing Unit

The processing unit/engine(s) (118) may be implemented as a combination of hardware and programming (for example, programmable instructions) to implement one or more functionalities of the processing unit (118). In the examples described herein, such combinations of hardware and programming may be implemented in several different ways. For example, the programming for the processing unit (118) may be processor-executable instructions stored on a non-transitory machine-readable storage medium and the hardware for the processing unit (118) may comprise a processing resource (for example, one or more processors), to execute such instructions. In the present examples, the machine-readable storage medium may store instructions that, when executed by the processing resource, implement the processing unit (118). In accordance with such examples, the system (110) may include the machine-readable storage medium storing the instructions and the processing resource to execute the instructions, or the machine-readable storage medium may be separate but accessible to the CCDU (106) and the processing resource. In other examples, the processing engine(s) (118) may be implemented by electronic circuitry.

The processing unit (118) may include one or more modules/engines selected from any of a base mode management controller (BMC) (312), Local area Network controllers (314) (interchangeably referred to as the Ethernet controllers (314) herein), a clock synchronizer module (316), and other module(s) (322).

Thermal Management Module

In an exemplary embodiment, the system (110) may be designed in an optimized way bearing thermal constraints in mind. Thermal management module may include one or mode thermal management techniques such as Liquid cooling, PCB materials, Vapour-chamber cooling, Heat-sink principles, Gallium Nitride (GaN), radio-over-fibre (RoF).

In an exemplary embodiment, the thermal management module can enable the CCDU (106)/system (110) to function in a predefined temperature range of 0 to 60° C. but not limited to it and also withstand extreme climatic conditions and surrounding environmental conditions.

In an exemplary embodiment, the thermal management module may be operatively coupled with an alarm device that may send alarm signals over dry contacts, temperature rise, critical environment conditions and critical electronic conditions. The system (110) may operate in a standard telecom power supply of −48 VDC but not limited to it with all required protection for telecom sites.

In an exemplary embodiment, the system (110) may be further coupled to one or more alarm devices (not shown in the FIG. 1B) that may send alarm signals over dry contacts, temperature rise, critical environment conditions and critical electronic conditions. The system (110) may operate in a standard telecom power supply of −48 VDC but not limited to it with all required protection for telecom sites.

In an aspect, a method for heat dissipation by the thermal management system in the CCDU (106) may include the following steps:

As a first step, the processing unit (118) may receive a set of signals pertaining to temperature of the system (110).

As a second step, the processing unit (118) may compare the set of signals with a predefined threshold temperature range.

As a third step, the processing unit (118) may execute one or more thermal management techniques if the temperature of the set of signals is more than the predefined threshold temperature range.

In an exemplary embodiment, a communication network may include, by way of example but not limitation, at least a portion of one or more networks having one or more nodes that transmit, receive, forward, generate, buffer, store, route, switch, process, or a combination thereof, etc. one or more messages, packets, signals, waves, voltage or current levels, some combination thereof, or so forth. A network may include, by way of example but not limitation, one or more of: a wireless network, a wired network, an internet, an intranet, a public network, a private network, a packet-switched network, a circuit-switched network, an ad hoc network, an infrastructure network, a Public-Switched Telephone Network (PSTN), a cable network, a cellular network, a satellite network, a fiber optic network, some combination thereof.

In an embodiment, the one or more user equipments (102) may communicate with the system (110) via set of executable instructions residing on any operating system, including but not limited to, Android™, iOS™, Kai OS™ and the like. In an embodiment, the one or more user equipments (102) and the one or more mobile devices may include, but not limited to, any electrical, electronic, electro-mechanical or an equipment or a combination of one or more of the above devices such as mobile phone, smartphone, Virtual Reality (VR) devices, Augmented Reality (AR) devices, laptop, a general-purpose computer, desktop, personal digital assistant, tablet computer, mainframe computer, or any other computing device, wherein the computing device may include one or more in-built or externally coupled accessories including, but not limited to, a visual aid device such as camera, audio aid, a microphone, a keyboard, input devices for receiving input from a user such as touch pad, touch enabled screen, electronic pen, receiving devices for receiving any audio or visual signal in any range of frequencies and transmitting devices that can transmit any audio or visual signal in any range of frequencies. It may be appreciated that the one or more user equipments (102), and the one or more mobile devices may not be restricted to the mentioned devices and various other devices may be used. A smart computing device may be one of the appropriate systems for storing data and other private/sensitive information.

Figure 4:
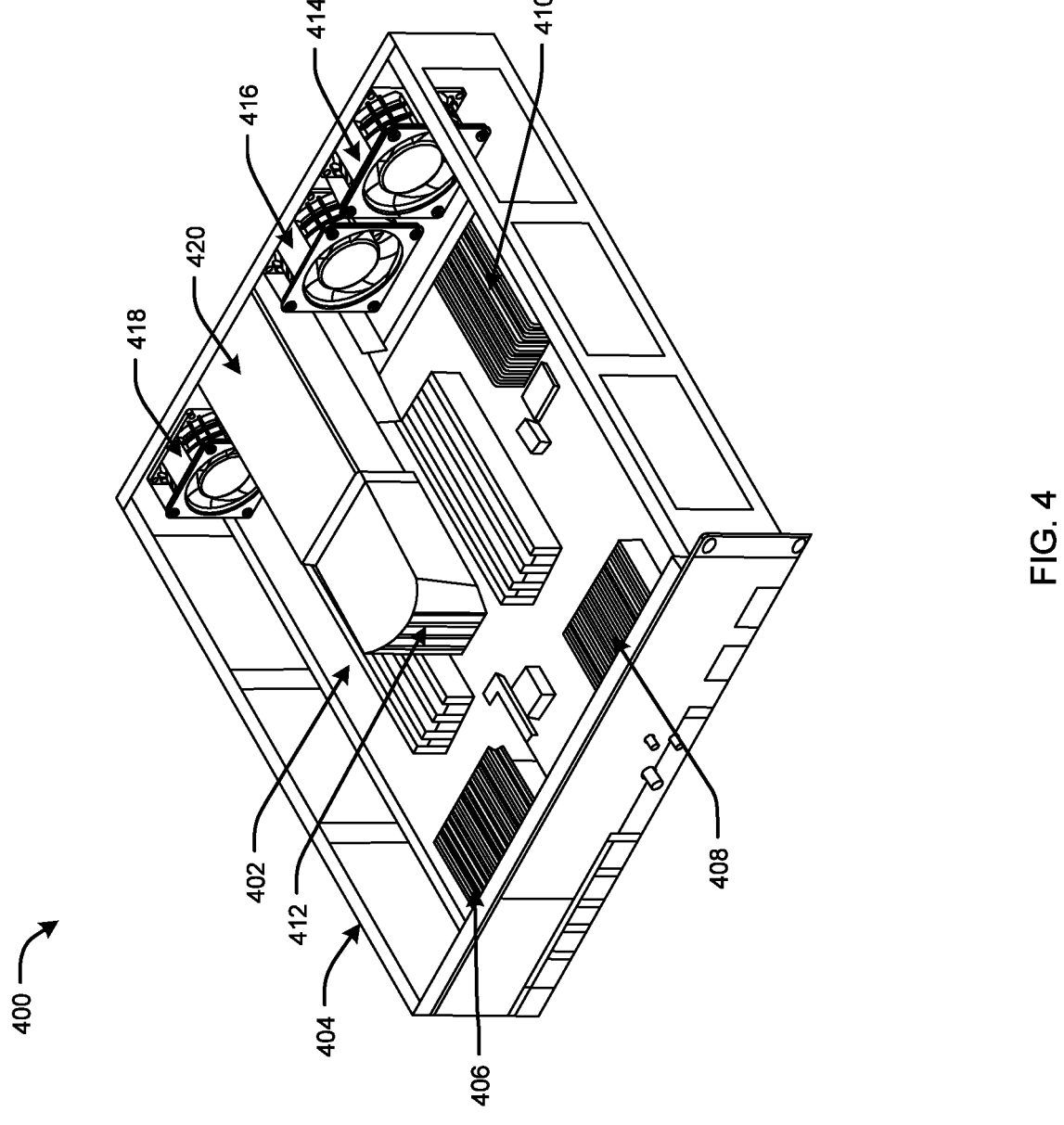
FIG. 4 illustrates an exemplary thermal management system of the CCDU, in accordance with an embodiment of the present disclosure.

FIG. 4 illustrates an exemplary thermal management system of the CCDU, in accordance with an embodiment of the present disclosure.

As illustrated in FIG. 4, the thermal management system may include a base insulator (402) configured at the base of the CCDU (404). A plurality of heat sinks (406, 408, 410, 412) may be configured on the base insulator to dissipate the heat generated from the thermal management unit. Further, the base insulator (402) may be a chassis base insulator configured to insulate a plurality of electrically conductive chassis. A plurality of fans (414, 416, 418) may be configured with the CCDU (402) to enable the dissipation of heat generated from the plurality of heat sinks. Additionally, the CCDU (404) may include an air duct (420) to allow an air flow into the CCDU (402) and enhance the dissipation of heat generated from the plurality of heat sinks.

Exemplary Computer System 500

Figure 5:
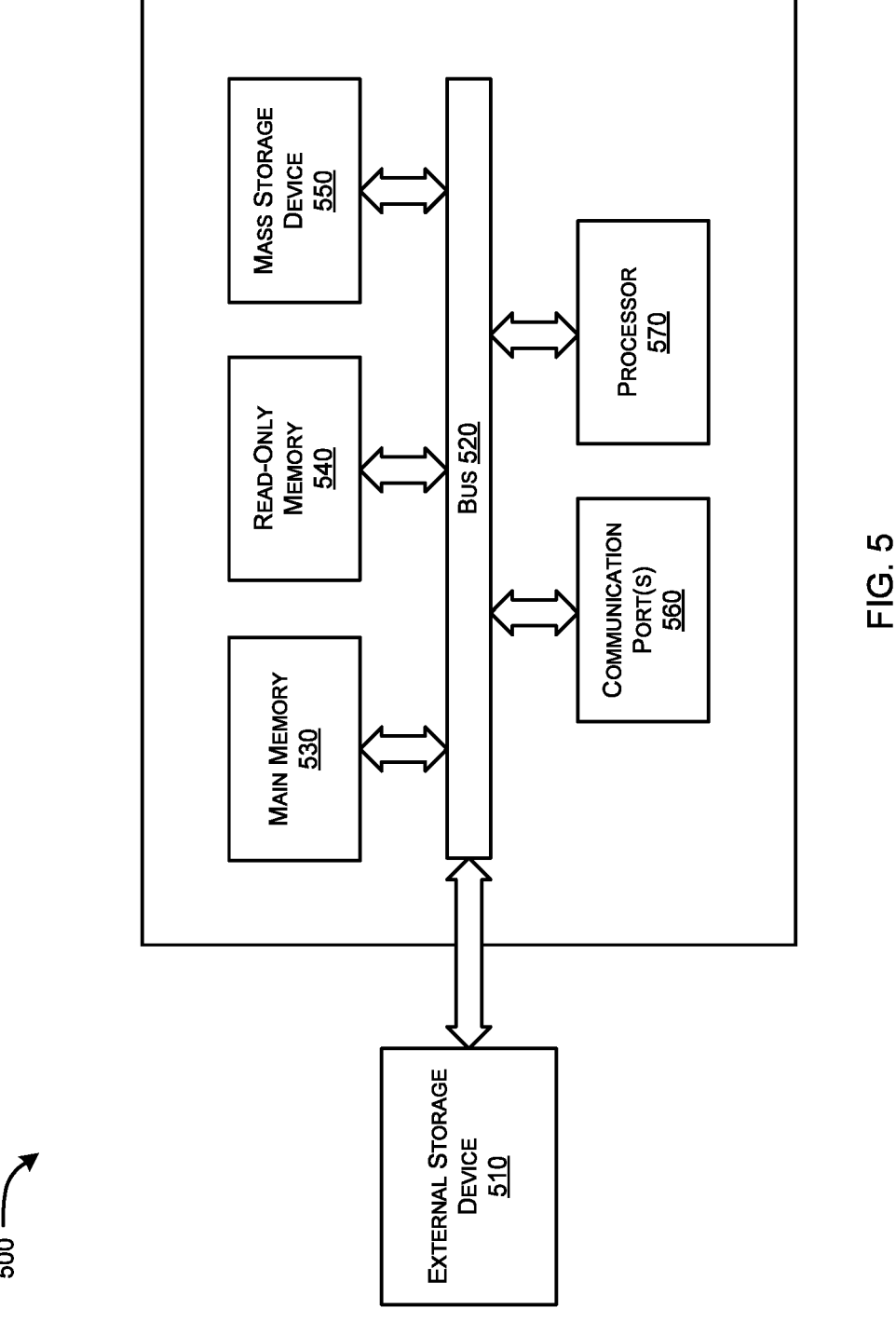
FIG. 5 illustrates an exemplary computer system in which or with which embodiments of the present invention can be utilized in accordance with embodiments of the present disclosure.

FIG. 5 illustrates an exemplary computer system in which or with which embodiments of the present invention can be utilized in accordance with embodiments of the present disclosure. As shown in FIG. 5, computer system (500) can include an external storage device (510), a bus (520), a main memory (530), a read only memory (540), a mass storage device (550), communication port(s) (560), and a processor (570). A person skilled in the art will appreciate that the computer system may include more than one processor and communication ports. The processor (570) may include various modules associated with embodiments of the present invention. Communication port (560) can be any of an RS-232 port for use with a modem based dialup connection, a 10/100 Ethernet port, a Gigabit or 10 Gigabit port using copper or fibre, a serial port, a parallel port, or other existing or future ports. Communication port (560) may be chosen depending on a network, such a Local Area Network (LAN), Wide Area Network (WAN), or any network to which computer system connects. Memory (530) can be Random Access Memory (RAM), or any other dynamic storage device commonly known in the art. Read-only memory (540) can be any static storage device(s) e.g., but not limited to, a Programmable Read Only Memory (PROM) chips for storing static information e.g., start-up or BIOS instructions for processor (570). Mass storage (550) may be any current or future mass storage solution, which can be used to store information and/or instructions. Exemplary mass storage solutions include, but are not limited to, Parallel Advanced Technology Attachment (PATA) or Serial Advanced Technology Attachment (SATA) hard disk drives or solid-state drives (internal or external, e.g., having Universal Serial Bus (USB) and/or Firewire interfaces), one or more optical discs, Redundant Array of Independent Disks (RAID) storage, e.g. an array of disks (e.g., SATA arrays).

Bus (520) communicatively couples processor(s) (570) with the other memory, storage and communication blocks. Bus (520) can be, e.g. a Peripheral Component Interconnect (PCI)/PCI Extended (PCI-X) bus, Small Computer System Interface (SCSI), USB or the like, for connecting expansion cards, drives and other subsystems as well as other buses, such a front side bus (FSB), which connects processor (570) to software system.

Optionally, operator and administrative interfaces, e.g. a display, keyboard, and a cursor control device, may also be coupled to bus (520) to support direct operator interaction with a computer system. Other operator and administrative interfaces can be provided through network connections connected through communication port (560). Components described above are meant only to exemplify various possibilities. In no way should the aforementioned exemplary computer system limit the scope of the present disclosure.

Thus, the present disclosure provides a unique and efficient hardware architecture design of thermal management module of the CCDU (106) may provide the functionality of CU and DU with a single box solution. The CCDU (106) may be designed for the outdoor application to operate over wide temperature range and different environment condition unlike Commercial of the shelf (COTs) servers which are used in AC environment quiet often. The CCDU (106) may have a chip down approach where all the components corresponding to the NIC cards are part of the single board which increases the Mean Time Between Failures (MTBF) and reduces cost significantly.

While considerable emphasis has been placed herein on the preferred embodiments, it will be appreciated that many embodiments can be made and that many changes can be made in the preferred embodiments without departing from the principles of the invention. These and other changes in the preferred embodiments of the invention will be apparent to those skilled in the art from the disclosure herein, whereby it is to be distinctly understood that the foregoing descriptive matter to be implemented merely as illustrative of the invention and not as limitation.

Advantages of the Present Disclosure

The present disclosure provides a thermal management system that protects the CCDU against extreme weather, climatic and heat conditions.

The present disclosure provides for a thermal management technique that protects the system and sends alarm during critical conditions.

We claim:

1. A thermal management system in a combined centralized and distributive unit (CCDU), said system comprising:
   - a single integrated board, the single integrated board further comprising:
     - a housing with a thermal management unit, the thermal management unit operatively coupled to a processing unit, said processing unit coupled to a memory, the memory storing instructions on execution of which, the processing unit causes the system to:
       - receive a set of signals pertaining to temperature of the system;
       - compare the set of signals with a predefined threshold temperature range; and
       - execute one or more thermal management techniques if the temperature of the set of signals is more than the predefined threshold temperature range.

2. The system as claimed in claim 1, wherein the one or more thermal management techniques comprises Liquid cooling, use of PCB materials, use of Vapour-chamber cooling, use of Heat-sink devices, use of Gallium Nitride (GaN), and use of radio-over-fibre (RoF).

3. The system as claimed in claim 1, wherein the thermal management unit is operatively coupled with an alarm device that sends alarm signals over dry contacts, temperature rise, critical environment conditions, and critical electronic conditions.

4. The system as claimed in claim 1, wherein the thermal management unit comprises a base insulator configured at the base of the CCDU, and wherein a plurality of heat sinks are configured on the base insulator to dissipate heat generated from the thermal management unit.

5. The system as claimed in claim 4, wherein the base insulator is a chassis base insulator configured to insulate a plurality of electrically conductive chassis.

6. The system as claimed in claim 4, wherein a plurality of fans are configured with the CCDU to enable the dissipation of heat generated from the plurality of heat sinks.

7. The system as claimed in claim 4, wherein the thermal management unit comprises an air duct to allow an airflow into the CCDU and enhance the dissipation of heat generated from the plurality of heat sinks.

8. A method for heat dissipation by a thermal management system in a combined centralized and distributive unit (CCDU), the method comprising:
   - utilizing a single integrated board, the single integrated board further comprising a housing with a thermal management unit, the thermal management unit operatively coupled to a processing unit;
   - receiving, by the processing unit, a set of signals pertaining to temperature of a system;
   - comparing, by the processing unit, the set of signals with a predefined threshold temperature range; and
   - executing, by the processing unit, one or more thermal management techniques if the temperature of the set of signals is more than the predefined threshold temperature range.

9. A non-transitory computer readable medium storing instructions, for a thermal management system in a combined centralized and distributive unit (CCDU), that are executable by a single integrated board, the single integrated board further comprising:
   - a housing with a thermal management unit and the thermal management unit operatively coupled to a processor to:
   - receive a set of signals pertaining to temperature of a system;
   - compare the set of signals with a predefined threshold temperature range; and
   - execute one or more thermal management techniques if the temperature of the set of signals is more than the predefined threshold temperature range.

\* \* \* \* \*